(12) United States Patent
Jeon et al.

(10) Patent No.: US 8,772,834 B2
(45) Date of Patent: Jul. 8, 2014

(54) HIGH ELECTRON MOBILITY TRANSISTOR AND METHOD OF DRIVING THE SAME

(71) Applicant: Samsung Electronics Co., Ltd., Suwon-Si (KR)

(72) Inventors: Woo-chul Jeon, Daegu (KR); Jong-seob Kim, Hwaseong-si (KR); Ki-yeol Park, Suwon-si (KR); Young-hwan Park, Seoul (KR); Jae-joon Oh, Seongnam-si (KR); Jong-bong Ha, Yongin-si (KR); Jai-kwang Shin, Anyang-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 13/868,579

(22) Filed: Apr. 23, 2013

(65) Prior Publication Data

US 2014/0103969 A1    Apr. 17, 2014

(30) Foreign Application Priority Data

Oct. 11, 2012    (KR) .......................... 10-2012-0113034

(51) Int. Cl.
*H01L 29/00* (2006.01)
*H01L 29/205* (2006.01)
*H01L 29/778* (2006.01)
*H01L 29/66* (2006.01)

(52) U.S. Cl.
CPC ........ *H01L 29/7786* (2013.01); *H01L 29/7781* (2013.01); *H01L 29/7782* (2013.01); *H01L 29/66462* (2013.01); *H01L 29/66431* (2013.01)
USPC ...... 257/194; 257/76; 257/192; 257/E21.403; 257/E21.404; 257/E21.407; 257/E29.246; 257/E29.253; 438/172; 438/285; 438/287

(58) Field of Classification Search
CPC ............ H01L 29/7786; H01L 29/7781; H01L 29/7782; H01L 29/66462; H01L 29/66431
USPC ............ 257/76, 192, 194, E21.403, E21.404, 257/E21.407, E29.246, E29.253; 438/172, 438/285, 287
See application file for complete search history.

(56) References Cited

U.S. PATENT DOCUMENTS 7,622,763 B2    11/2009    Suda et al.
7,723,752 B2    5/2010    Yoshida et al.
(Continued)

FOREIGN PATENT DOCUMENTS

JP    2009-111217    5/2009
KR    10-2004-0018502    3/2004
(Continued)

*Primary Examiner* — Dao H Nguyen
(74) *Attorney, Agent, or Firm* — Harness, Dickey & Pierce, P.L.C.

(57) ABSTRACT

According to example embodiments, a HEMT includes a channel layer, a channel supply layer on the channel layer, a source electrode and a drain electrode spaced apart on the channel layer, a depletion-forming layer on the channel supply layer, and a plurality of gate electrodes on the depletion-forming layer between the source electrode and the drain electrode. The channel supply layer is configured to induce a two-dimensional electron gas (2DEG) in the channel layer. The depletion-forming layer is configured to form a depletion region in the 2DEG. The plurality of gate electrodes include a first gate electrode and a second gate electrode spaced apart from each other.

39 Claims, 10 Drawing Sheets

(56) References Cited

U.S. PATENT DOCUMENTS

| | | |
|---|---|---|
| 7,816,707 B2 | 10/2010 | Hikita et al. |
| 2001/0032997 A1 | 10/2001 | Forbes et al. |
| 2006/0273347 A1 | 12/2006 | Hikita et al. |
| 2008/0315256 A1* | 12/2008 | Ohta et al. ............ 257/194 |
| 2011/0018002 A1* | 1/2011 | Chen et al. ............ 257/76 |
| 2011/0108885 A1 | 5/2011 | Sazawa et al. |
| 2011/0297961 A1* | 12/2011 | Bunin et al. ............ 257/76 |
| 2012/0256233 A1* | 10/2012 | Cui et al. ............ 257/195 |
| 2012/0280278 A1* | 11/2012 | Curatola et al. ............ 257/191 |
| 2013/0140578 A1* | 6/2013 | Yu et al. ............ 257/76 |

FOREIGN PATENT DOCUMENTS

| | | |
|---|---|---|
| KR | 10-2007-0012852 | 1/2007 |
| KR | 10-0860070 B1 | 9/2008 |
| KR | 2010-0138871 A | 12/2010 |
| KR | 10-1008272 B1 | 1/2011 |
| KR | 20110041550 A | 4/2011 |
| KR | 20110058332 A | 6/2011 |
| WO | WO-2010/014128 A2 | 2/2010 |

* cited by examiner

HIGH ELECTRON MOBILITY TRANSISTOR AND METHOD OF DRIVING THE SAME

CROSS-REFERENCE TO RELATED APPLICATIONS

This application claims priority under 35 U.S.C. §119 to Korean Patent Application No. 10-2012-0113034, filed on Oct. 11, 2012, in the Korean Intellectual Property Office, the disclosure of which is incorporated herein in its entirety by reference.

BACKGROUND

1. Field

Example embodiments relate to semiconductor devices and/or methods of driving the same, and more particularly, to a high electron mobility transistor (HEMT) and/or a method of driving the same.

2. Description of the Related Art

Various power devices include a device for controlling a current flow by ON/OFF switching thereof, e.g., a power device. The efficiency of a power device may depend on efficiency of the power device in the power transform system.

Many power devices commercialized at present are silicon (Si)-based power Metal-Oxide-Semiconductor Field-Effect Transistors (MOSFETs) and Insulated Gate Bipolar Transistors (IGBTs). However, it may be difficult to increase the efficiency of a silicon-based power device due to the physical properties of silicon, and limitations from some manufacturing processes, and so forth. To overcome these limitations, research and development for increasing transform efficiency by applying a III-V group compound semiconductor to a power device has been conducted. In association with this, a high electron mobility transistor (HEMT) using a heterojunction structure of a compound semiconductor has attracted attention.

An HEMT may include semiconductor layers having different electrical polarization characteristics. In a HEMT, a semiconductor layer having a relatively high polarizability may induce a two-dimensional electron gas (2DEG) in another semiconductor layer attached thereto, and the 2DEG may have high electron mobility.

SUMMARY

Example embodiments relate to a high electron mobility transistor (HEMT) having a normally-off characteristic and a high threshold voltage and a method of driving the same.

Additional aspects will be set forth in part in the description that follows and, in part, will be apparent from the description, or may be learned by practice of example embodiments.

According to example embodiments, a high electron mobility transistor (HEMT) includes: a channel layer including a first semiconductor material; a channel supply layer on the channel layer, the channel supply layer including a second semiconductor material, the channel supply layer configured to induce a two-dimensional electron gas (2DEG) in the channel layer; a source electrode and a drain electrode at both sides of the channel supply layer; a depletion-forming layer on the channel supply layer, the depletion-forming layer configured to form a depletion region in the 2DEG; a first gate electrode on the depletion-forming layer, the first gate electrode between the source electrode and the drain electrode; and at least one second gate electrode separate from the first gate electrode on the depletion-forming layer and between the source electrode and the drain electrode.

In example embodiments, the HEMT may include one second gate electrode. The second gate electrode may be a floating electrode. The first and second gate electrodes may be configured such that applying a first gate voltage to the first gate electrode induces a second gate voltage in the second gate electrode.

In example embodiments, the first gate electrode and the second gate electrode may be connected to each other by the depletion-forming layer, the first gate electrode may be configured to induce the second gate voltage in the second gate electrode via the depletion-forming layer if the first gate voltage is applied to the first gate electrode.

In example embodiments, the depletion-forming layer may be a strip shape between the first gate electrode and the second gate electrode.

In example embodiments, the second gate electrode and the source electrode may be connected to each other by the depletion-forming layer. The depletion-forming layer may be a strip shape between the source electrode and the second gate electrode.

In example embodiments, a coating layer may cover at least a portion of an upper surface of the channel supply layer. The coating layer may be the same material as the depletion-forming layer. In this case, the coating layer may have a thinner thickness than a thickness of the depletion-forming layer.

In example embodiments, the first gate electrode may be configured to induce the second gate voltage in the second gate electrode via an upper surface of the channel supply layer.

In example embodiments, the second gate voltage induced in the second gate electrode may be determined by the first gate voltage applied to the first gate electrode, a gap between the first gate electrode and the second gate electrode, and a gap between the second gate electrode and the source electrode. A threshold voltage of the HEMT may be determined by the second gate voltage induced in the second gate electrode.

In example embodiments, the first semiconductor material may be, for example, a gallium nitride (GaN) group material, and the second semiconductor material may be, for example, at least one nitride including at least one of aluminum (Al), gallium (Ga), indium (In) and boron (B). The depletion-forming layer may include a p-type semiconductor material. The depletion-forming layer may include a III-V group nitride semiconductor material.

In example embodiments, the HEMT may include one gate electrode between the first gate electrode and the source electrode.

According to example embodiments, a method of driving the HEMT described above includes applying a first gate voltage to the first gate electrode; and inducing a second gate voltage in a floating electrode by applying the first gate voltage to the first gate electrode, wherein the HEMT includes one second gate electrode and the second gate electrode is the floating electrode.

According to example embodiments, a high electron mobility transistor (HEMT) includes: a channel layer; a channel supply layer on the channel layer, the channel supply layer configured to induce a two-dimensional electron gas (2DEG) in the channel layer; a source electrode and a drain electrode spaced apart on the channel layer; a depletion-forming layer configured to form a depletion region in the 2DEG; and a plurality of gate electrodes on the depletion-forming layer between the source electrode and the drain electrode, the plurality of gate electrodes including a first gate electrode and a second gate electrode laterally spaced apart from each other.

In example embodiments, the second gate electrode may be a floating electrode between the source electrode and the first gate electrode, and the first and second gate electrodes may be configured such that applying a first gate voltage to the first gate electrode induces a second gate voltage in the second gate electrode.

In example embodiments, the plurality of electrodes may include a third gate electrode on the depletion-forming layer, and the third gate electrode may be spaced apart between the second gate electrode and the source electrode.

In example embodiments, a portion of the depletion-forming layer may extend between at least two of the first electrode, second electrode, third electrode, and source electrode.

In example embodiments, a portion of the depletion-forming layer may extend from the second gate electrode to at least one of the source electrode and the first gate electrode.

In example embodiments, the depletion forming layer may expose at least one of: an entire upper surface of the channel supply layer between the source electrode and the second gate electrode, and an entire upper surface of the channel supply layer between the second gate electrode and the first gate electrode.

In example embodiments, at least one of the source electrode and the drain electrode is connected to a sidewall of the channel supply layer.

In example embodiments, the depletion forming layer may have a grid shape.

In example embodiments, the channel layer may include a group III-V compound semiconductor.

In example embodiments, a material of the channel supply layer may be different than a material of the channel layer in terms of at least one of a polarization characteristic, an energy band gap, and a lattice constant.

In example embodiments, the depletion-forming layer may include a p-type semiconductor material.

In example embodiments, the second gate electrode may be configured to raise a threshold voltage of the HEMT compared to a similar-formed HEMT that does not include the second gate electrode.

According to example embodiments, a method of the driving the foregoing HEMT includes applying a first gate voltage to the first gate electrode; and inducing a second gate voltage in a floating electrode by applying the first gate voltage to the first gate electrode.

In example embodiments, the applying the first gate voltage may include forming a first channel under the first gate electrode in the channel layer, and the first gate voltage may be greater than a first threshold voltage forming the first channel.

In example embodiments, the applying first gate voltage may include inducing the second gate voltage in the second gate electrode at a level that is greater than a second threshold voltage for forming a second channel under the second gate electrode in the channel layer, and the applying the first gate voltage may further include forming the second channel under the second gate electrode in the channel layer.

BRIEF DESCRIPTION OF THE DRAWINGS

The foregoing and/or other features and advantages of example embodiments will become apparent and more readily appreciated from the following description of non-limiting example embodiments, taken in conjunction with the accompanying drawings in which like reference characters refer to the same parts throughout the different views. The drawings are not necessarily to scale, emphasis instead being placed upon illustrating the principles of example embodiments. In the drawings.

DETAILED DESCRIPTION

Figure 1:
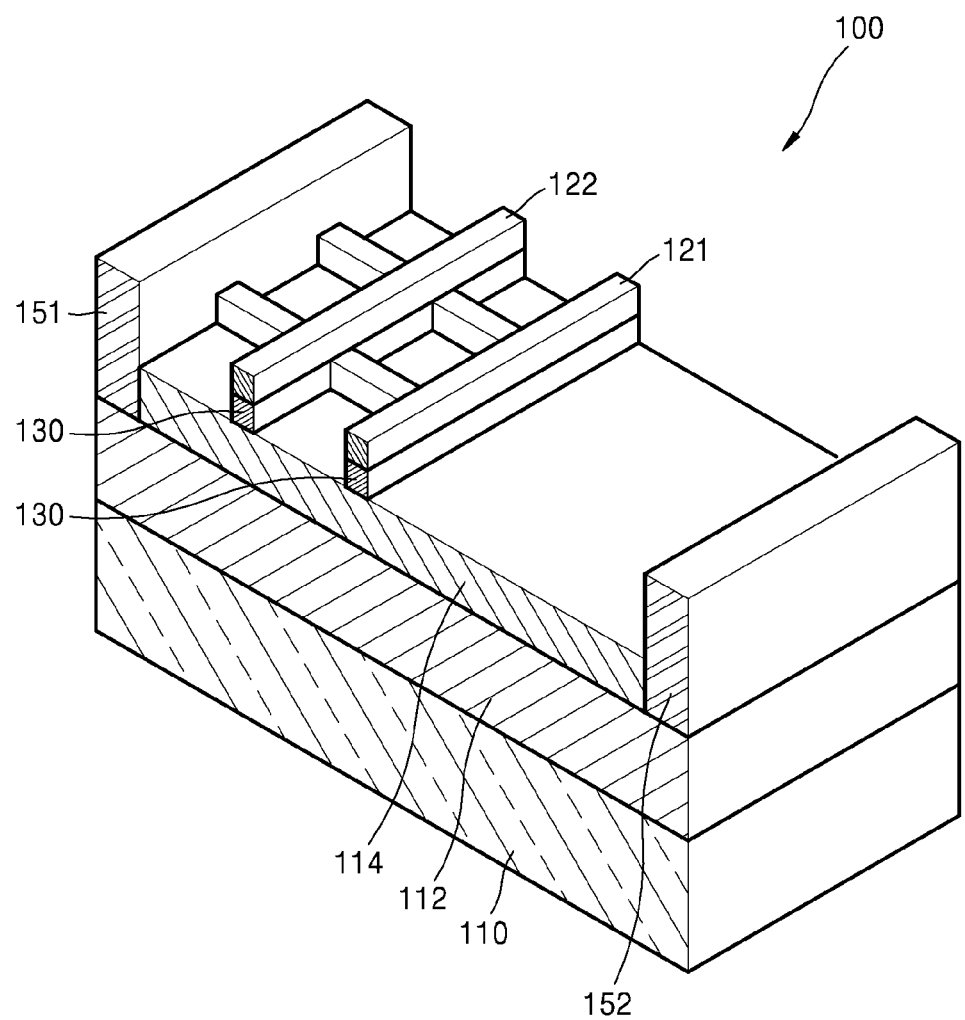
FIG. 1 is a perspective view of a high electron mobility transistor (HEMT) according to example embodiments.

Example embodiments will now be described more fully with reference to the accompanying drawings, in which some example embodiments are shown. Example embodiments, may, however, be embodied in many different forms and should not be construed as being limited to the embodiments set forth herein; rather, these example embodiments are provided so that this disclosure will be thorough and complete, and will fully convey the scope of example embodiments to those of ordinary skill in the art. In the drawings, the thicknesses of layers and regions are exaggerated for clarity. Like reference numerals in the drawings denote like elements, and thus their description may be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof. Expressions such as "at least one of," when preceding a list of elements, modify the entire list of elements and do not modify the individual elements of the list.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 2:
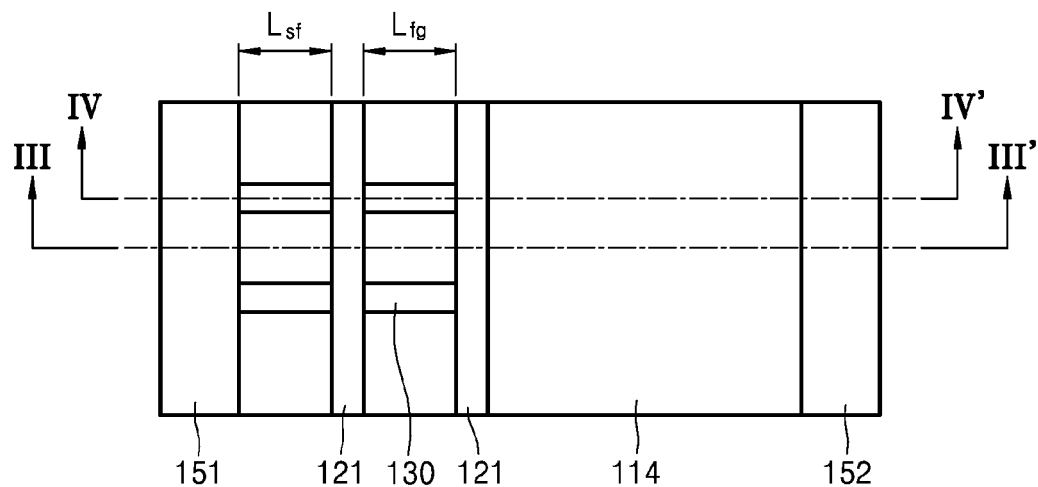
FIG. 2 is a top view of the HEMT of FIG. 1.
Figure 3:
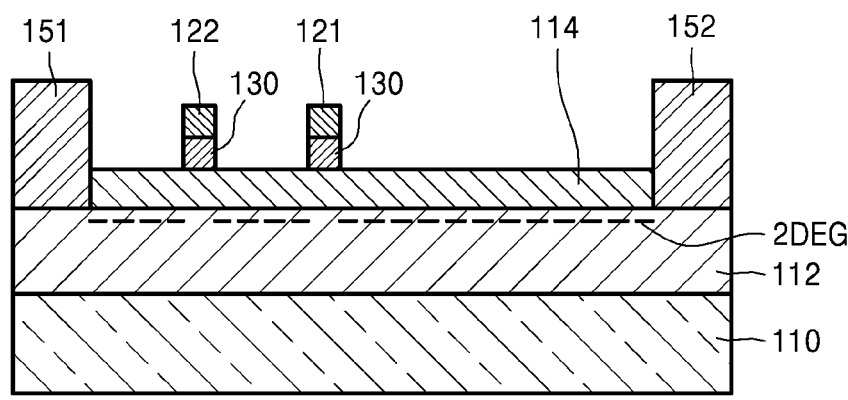
FIG. 3 is a cross-sectional view through III-III' of FIG. 2.
Figure 4:
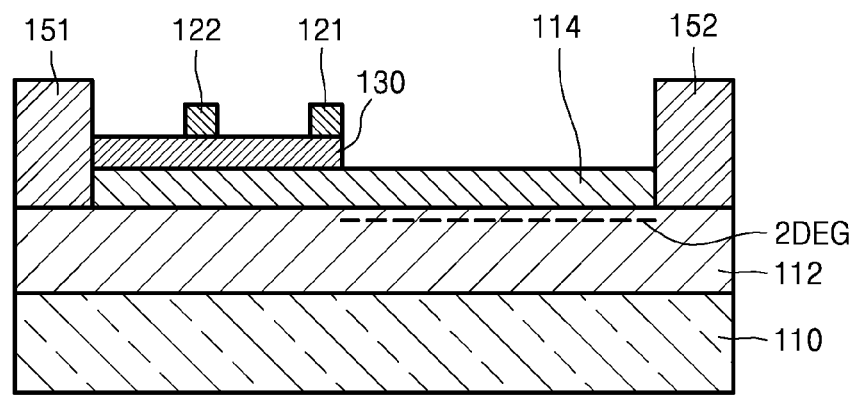
FIG. 4 is a cross-sectional view through IV-IV' of FIG. 2.

FIG. 1 is a perspective view of a high electron mobility transistor (HEMT) 100 according to an example embodiments, FIG. 2 is a top view of the HEMT 100 of FIG. 1, FIG. 3 is a cross-sectional view through III-III' of FIG. 2, and FIG. 4 is a cross-sectional view through IV-IV' of FIG. 2.

Referring to FIGS. 1 to 4, a channel layer 112 is formed on a substrate 110. The substrate 110 may include a semiconductor, for example, sapphire, silicon (Si), silicon carbide (SiC), or gallium nitride (GaN). However, this is only illustrative, and the substrate 110 may include other various materials. The channel layer 112 may include a first semiconductor material. The first semiconductor material may be a group III-V compound semiconductor material but is not limited thereto. For example, the channel layer 112 may be a GaN group material layer, in detail, a GaN layer. In this case, the channel layer 112 may be an undoped GaN layer, and in some cases, the channel layer 112 may be a GaN layer doped with desired (and/or alternatively predetermined) impurities.

Although not shown, a buffer layer may be further formed between the substrate 110 and the channel layer 112. The buffer layer may be formed to reduce (and/or prevent) a decrease in crystallizability of the channel layer 112 by alleviating a lattice constant difference and a thermal expansion coefficient difference between the substrate 110 and the channel layer 112. The buffer layer includes one or more materials selected from nitrides including at least one of Al, Ga, In, and B and may have a single-layer structure or a multi-layer structure. For example, the buffer layer may include at least one selected from the group consisting of AlN, GaN, AlGaN, InGaN, AlInN, or AlGaInN. A seed layer (not shown) for growing the buffer layer may be further formed between the substrate 110 and the buffer layer.

A channel supply layer 114 may be formed on the channel layer 112. The channel supply layer 114 may induce a two-dimensional electron gas (2DEG) in the channel layer 112. The 2DEG may be formed in the channel layer 112 below the interface between the channel layer 112 and the channel supply layer 114. The channel supply layer 114 may include a second semiconductor material other than the first semiconductor material forming the channel layer 112. The second semiconductor material may be different from the first semiconductor material with respect to at least one selected from the group consisting of a polarization characteristic, an energy bandgap, and a lattice constant. In detail, the second semiconductor material may be higher than the first semiconductor material with respect to at least one selected from the group consisting of a polarizability and the energy bandgap.

The channel supply layer 114 may include at least one selected from nitrides including at least one selected from the group consisting of, for example, Al, Ga, In, and B and may have a single-layer structure or a multi-layer structure. In detail, the channel supply layer 114 may include at least one selected from the group consisting of AlGaN, AlInN, InGaN, AlN, and AlGaInN but is not limited thereto. The channel supply layer 114 may be an undoped layer or a layer doped with desired (and/or alternatively predetermined) impurities. The thickness of the channel supply layer 114 may be, for example, less than several tens of nm. For example, the thickness of the channel supply layer 114 may be equal to or less than about 50 nm but is not limited thereto.

A source electrode 151 and a drain electrode 152 may be formed on the channel layer 112 at both sides of the channel supply layer 114. The source electrode 151 and the drain electrode 152 may be electrically connected to the 2DEG. The source electrode 151 and the drain electrode 152 may be formed on the channel supply layer 114 or formed to be inserted inside the channel supply layer 114 or the channel layer 112. Besides, the source electrode 151 and the drain electrode 152 may be variously formed.

A depletion-forming layer 130 may be formed with a desired (and/or alternatively predetermined) thickness on the channel supply layer 114 and between the source electrode 151 and the drain electrode 152. The depletion-forming layer 130 may function to form a depletion region in the 2DEG. An energy bandgap of a portion of the channel supply layer 114, which is located below the depletion-forming layer 130, may increase due to the depletion-forming layer 130, resulting in forming the depletion region of the 2DEG at a portion of the channel layer 112 corresponding to the depletion-forming layer 130. Thus, a portion corresponding to the depletion-forming layer 130 in the 2DEG may be cut off or have different characteristics (e.g., electron density and so forth) from the remaining portion thereof. A region in which the 2DEG is cut off may be a 'cut-off region', and the HEMT 100 may have a normally-off characteristic due to the cut-off region.

The depletion-forming layer 130 may include a p-type semiconductor material. That is, the depletion-forming layer 130 may be a p-type semiconductor layer or a semiconductor layer doped with p-type impurities. In addition, the depletion-forming layer 130 may include a III-V group nitride semiconductor. For example, the depletion-forming layer 130 may include at least one selected from the group consisting of GaN, AlGaN, InN, AlInN, InGaN, and AlInGaN. The depletion-forming layer may be doped with p-type impurities such as magnesium (Mg). In detail, the depletion-forming layer 130 may be a p-GaN layer or a p-AlGaN layer, but example embodiments are not limited thereto. The depletion-forming layer 130 may cause an energy bandgap of a portion of the channel supply layer 114 therebelow to increase, thereby forming a cut-off region of the 2DEG.

The depletion-forming layer 130 may be formed in a strip shape as shown in FIG. 1 between a first gate electrode 121 and a second gate electrode 122 to be described below. In addition, the depletion-forming layer 130 may be formed in a strip shape between the source electrode 151 and the second gate electrode 122. However, the depletion-forming layer 130 is not limited thereto and may be formed in various other shapes. In other words, the depletion-forming layer 130 may have a grid shape so the depletion-forming layer 130 extends between channel supply layer 114 and the first and second gate electrodes 121 and 122, so portions of the depletion-forming layer 130 extend between the first gate electrode 121 and the second gate electrode 122, and other portions of the depletion forming layer 130 extend between the source electrode 151 and the second gate electrode 122. A portion of the depletion forming layer 130 may contact a sidewall of the source electrode 151.

The first gate electrode 121 may be formed on the depletion-forming layer 130. The first gate electrode 121 may include various metal materials, metal compounds, or the like. The first gate electrode 121 may be formed with the same width as the depletion-forming layer 130. Alternatively, the first gate electrode 121 may be formed with a wider width than the depletion-forming layer 130. The first gate electrode 121 may be closer to the source electrode 151 than the drain electrode 152. However, this is only illustrative, and the location of the first gate electrode 121 may be variously changed.

The second gate electrode 122 may be formed on the depletion-forming layer 130 and between the source electrode 151 and the first gate electrode 121. The second gate electrode 122 may be formed to be separated from the first gate electrode 121 by a desired (and/or alternatively predetermined) distance. The second gate electrode 122 may include the same materials as the first gate electrode 121. However, the second gate electrode 122 is not necessarily limited thereto. In addition, the depletion-forming layer 130 may be formed between the first gate electrode 121 and the second gate electrode 122 and between the source electrode 151 and the second gate electrode 122 to electrically connect source electrode 151 to the second gate electrode 122 and electrically connect the second gate electrode 122 to the first gate electrode 121. The depletion-forming layer 130 between the first gate electrode 121 and the second gate electrode 122 and the depletion-forming layer 130 between the source electrode 151 and the second gate electrode 122 may be formed in a strip shape and may have the same resistance value per unit length. However, the depletion-forming layer 130 is not necessarily limited thereto.

In example embodiments, the second gate electrode 122 may be a floating electrode to which a second gate voltage is induced when a first gate voltage is applied to the first gate electrode 121. A voltage lower than that applied to the first gate electrode 121 may be induced in the second gate electrode 122. The second gate voltage induced in the second gate electrode 122 may be determined by the first gate voltage applied to the first gate electrode 121, a gap between the first gate electrode 121 and the second gate electrode 122, and a gap between the source electrode 151 and the second gate electrode 122. In detail, when the first gate voltage is $V_{g1}$, the gap between the first gate electrode 121 and the second gate electrode 122 is $L_{fg}$, and the gap between the source electrode 151 and the second gate electrode 122 is $L_{sf}$, the second gate voltage $V_{g2}$ induced in the second gate electrode 122 may be proportionate to or approximate to $V_{g1} \times L_{sf}/(L_{fg}+L_{sf})$. The second gate voltage $V_{g2}$ may be adjusted by changing a location of the first gate electrode 121 and/or the second gate electrode 122.

As described below, the second gate electrode 122 that is a floating electrode functions to increase a threshold voltage $V_{th}$ of the HEMT 100, and the threshold voltage $V_{th}$ of the HEMT 100 may be determined by the second gate voltage $V_{g2}$ induced in the second gate electrode 122.

Figure 5A:
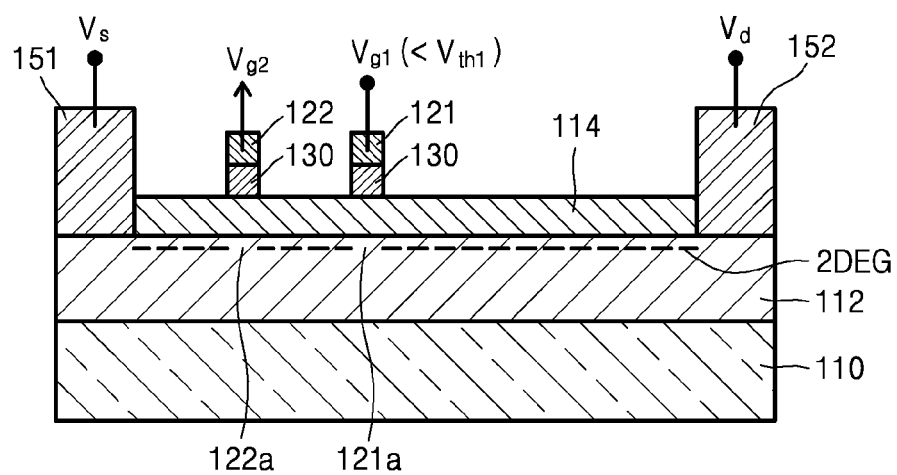
FIGS. 5A to 5C illustrate a channel forming process according to a first gate voltage in the HEMT of FIG. 1.
Figure 5B:
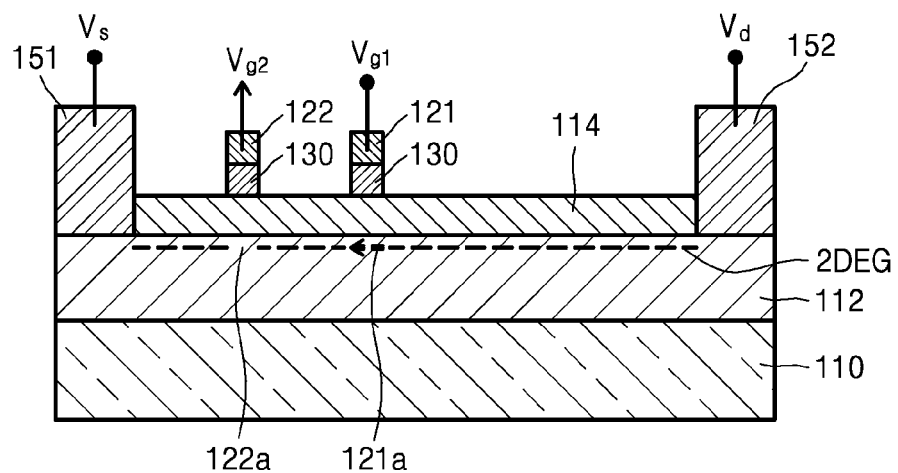
Figure 5C:
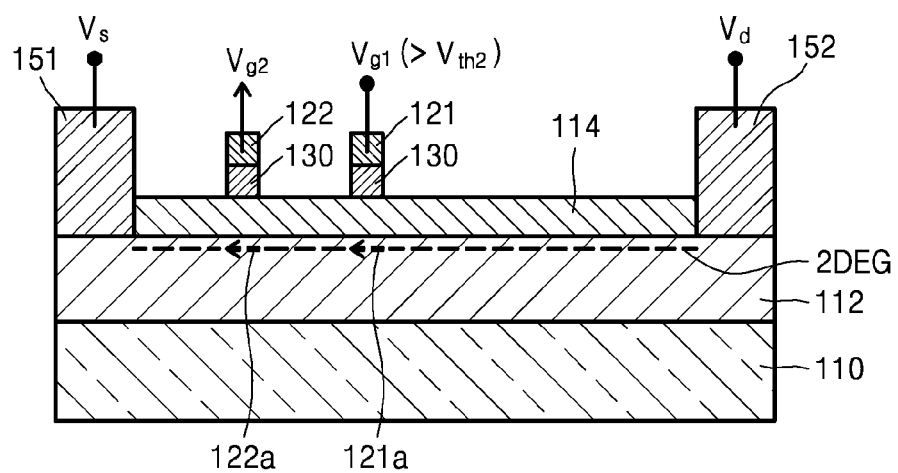

FIGS. 5A to 5C illustrate a channel forming process according to a voltage applied to the first gate electrode 121 in the HEMT 100 of FIG. 1. In FIGS. 5A to 5C, a desired (and/or alternatively predetermined) source voltage $V_s$ and a desired (and/or alternatively predetermined) drain voltage $V_d$ may be applied to the source electrode 151 and the drain electrode 152, respectively. When the first gate voltage applied to the first gate electrode 121 is $V_{g1}$, the gap between the first gate electrode 121 and the second gate electrode 122 is $L_{fg}$, and the gap between the source electrode 151 and the second gate electrode 122 is $L_{sf}$, the second gate voltage $V_{g2}$ induced in the second gate electrode 122 may be calculated by $V_{g2} \approx V_{g1} \times L_{sf}/(L_{fg}+L_{sf})$.

FIG. 5A shows a case where the first gate voltage $V_{g1}$ applied to the first gate electrode 121 is lower than a first threshold voltage $V_{th1}$. The first threshold voltage $V_{th1}$ indicates a minimum voltage for causing first and second channels 121a and 122a respectively formed below the first and second gate electrodes 121 and 122 to be in an ON state. Referring to FIG. 5A, when the first gate voltage $V_{g1}$ applied to the first gate electrode 121 is lower than the first threshold voltage $V_{th1}$, the second gate voltage $V_{g2}$ induced in the second gate electrode 122 is also lower than the first threshold voltage $V_{th1}$. Thus, both the first channel 121a formed below the first gate electrode 121 and the second channel 122a formed below the second gate electrode 122 are in an OFF state.

FIG. 5B shows a case where the first gate voltage $V_{g1}$ applied to the first gate electrode 121 is higher than the first threshold voltage $V_{th1}$ and lower than a second threshold voltage $V_{th2}$. The second threshold voltage $V_{th2}$ is proportionate to and/or approximate to $V_{th1} \times (L_{fg}+L_{sf})/L_{sf}$. Referring to FIG. 5B, when the first gate voltage $V_{g1}$ applied to the first gate electrode 121 is higher than the first threshold voltage $V_{th1}$ and lower than the second threshold voltage $V_{th2}$, the second gate voltage $V_{g2}$ induced in the second gate electrode 122 is lower than the first threshold voltage $V_{th1}$. Thus, while the first channel 121a formed below the first gate electrode 121 is in the ON state, the second channel 122a formed below the second gate electrode 122 is in the OFF state.

FIG. 5C shows a case where the first gate voltage $V_{g1}$ applied to the first gate electrode 121 is higher than the second threshold voltage $V_{th2}$. Referring to FIG. 5C, when the first gate voltage $V_{g1}$ applied to the first gate electrode 121 is higher than the second threshold voltage $V_{th2}$, the second gate voltage $V_{g2}$ induced in the second gate electrode 122 is higher than the first threshold voltage $V_{th1}$. Thus, both the first channel 121a formed below the first gate electrode 121 and the second channel 122a formed below the second gate electrode 122 are in the ON state, and as a result, a current flows through the channel layer 111 of the HEMT 100.

As described above, the HEMT 100 has a normally-off characteristic. In addition, the HEMT 100 has the second gate electrode 122 that is a floating electrode between the source electrode 151 and the first gate electrode 121, thereby increasing the threshold voltage $V_{th}$ of the HEMT 100 from the first threshold voltage $V_{th1}$ to the second threshold voltage $V_{th2}$. In addition, by changing a location of the first gate electrode 121 and/or the second gate electrode 122, the threshold voltage $V_{th}$ of the HEMT 100 may be adjusted. Although it has been described that the depletion-forming layer 130 of a strip shape is formed between the source electrode 151 and the second gate electrode 122, the depletion-forming layer 130 may alternatively be arranged so the depletion-forming layer is not formed between the source electrode 151 and the second gate electrode 122. In addition, although it has been described that one second gate electrode 122 may be formed between the source electrode 151 and the first gate electrode 121, a plurality of second gate electrodes 122 may be formed between the source electrode 151 and the first gate electrode 121.

Figure 6:
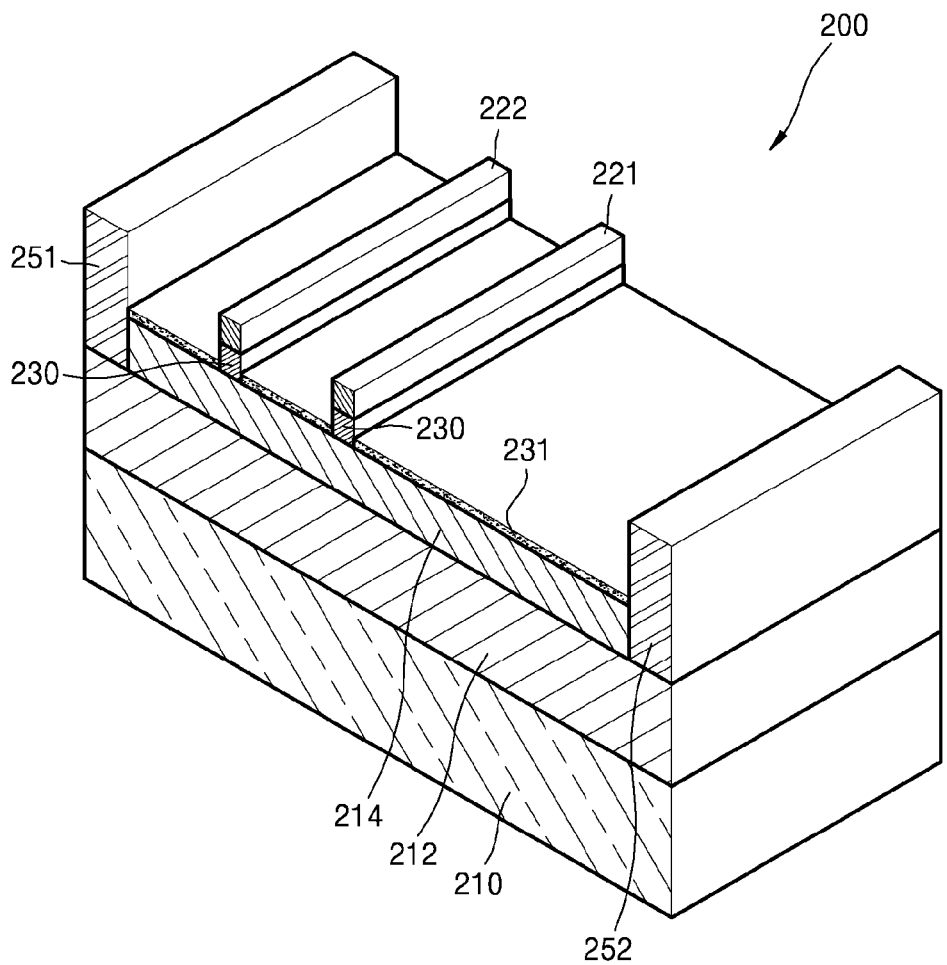
FIG. 6 is a perspective view of an HEMT according to example embodiments.
Figure 7:
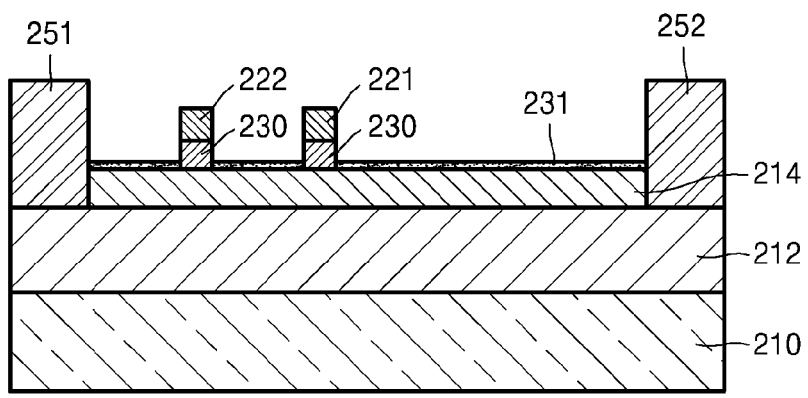
FIG. 7 is a cross-sectional view of the HEMT of FIG. 6.

FIG. 6 is a perspective view of an HEMT 200 according to example embodiments, and FIG. 7 is a cross-sectional view of the HEMT 200 of FIG. 6. Hereinafter, differences between the HEMT 200 and the HEMT 100 in FIG. 1 will be mainly described.

Referring to FIGS. 6 and 7, a channel layer 212 is formed on a substrate 210. The channel layer 212 may include a first semiconductor material. The first semiconductor material may be a III-V group compound semiconductor material but is not limited thereto. For example, the channel layer 212 may be a GaN group material layer, in detail, a GaN layer. Although not shown, a desired (and/or alternatively predetermined) buffer layer may be further provided between the substrate 210 and the channel layer 212.

A channel supply layer 214 may be formed on the channel layer 212. The channel supply layer 214 may induce a 2DEG to the channel layer 212. The channel supply layer 214 may include a second semiconductor material other than the first semiconductor material forming the channel layer 212. The second semiconductor material may be different from the first semiconductor material with respect to at least one selected from the group consisting of a polarization characteristic, an energy bandgap, and a lattice constant. In detail, the second semiconductor material may be higher than the first semiconductor material with respect to at least one selected from the group consisting of a polarizability and the energy bandgap. The channel supply layer 214 may include at least one selected from nitrides including at least one selected from the group consisting of, for example, Al, Ga, In, and B and may have a single-layer structure or a multi-layer structure. In detail, the channel supply layer 214 may include at least one selected from the group consisting of AlGaN, AlInN, InGaN, AlN, and AlGaInN but is not limited thereto.

A source electrode 251 and a drain electrode 252 may be formed on the channel layer 212 at both sides of the channel supply layer 214. The source electrode 251 and the drain electrode 252 may be formed on the channel supply layer 214 or formed to be inserted inside the channel supply layer 214 or the channel layer 212. Besides, the source electrode 251 and the drain electrode 252 may be variously formed.

A depletion-forming layer 230 may be formed with a desired (and/or alternatively predetermined) thickness on the channel supply layer 214 and between the source electrode 251 and the drain electrode 252. The depletion-forming layer 230 may function to form a depletion region in the 2DEG. The depletion-forming layer 230 may include a p-type semiconductor material. That is, the depletion-forming layer 230 may be a p-type semiconductor layer or a semiconductor layer doped with p-type impurities. In addition, the depletion-forming layer 230 may include a III-V group nitride semiconductor. For example, the depletion-forming layer 230 may include at least one selected from the group consisting of GaN, AlGaN, InN, AlInN, InGaN, and AlInGaN. The depletion-forming layer 230 may be doped with p-type impurities such as Mg. In detail, the depletion-forming layer 230 may be a p-GaN layer or a p-AlGaN layer. The depletion-forming layer 230 may cause an energy bandgap of a portion of the channel supply layer 214 therebelow to increase, thereby forming a cut-off region of the 2DEG. The depletion-forming layer 230 may be formed in a shape corresponding to first and second gate electrodes 221 and 222 to be described below.

The first gate electrode 221 may be formed on the depletion-forming layer 230. In addition, the second gate electrode 222 may be formed on the depletion-forming layer 230 and between the source electrode 251 and the first gate electrode 221. A coating layer 231 may be formed to cover an exposed upper surface of the channel supply layer 214. The coating layer 231 may function to protect the channel supply layer 214 below. In example embodiments, the coating layer 231 may have the same material as the depletion-forming layer 230. In this case, the coating layer 231 may be formed with a substantially thinner thickness than the depletion-forming layer 230 so that a depletion region is not formed in the coating layer 231. The coating layer 231 may be formed of a material other than the depletion-forming layer 230. Although it is illustrated in FIGS. 6 and 7 that the coating layer 231 is formed to cover the entire exposed upper surface of the channel supply layer 214, the coating layer 231 is not limited thereto and may be formed to cover only a portion of the exposed upper surface of the channel supply layer 214.

The second gate electrode 222 is a floating electrode to which a second gate voltage is induced when a first gate voltage is applied to the first gate electrode 221. In example embodiments, when the first gate voltage is applied to the first gate electrode 221, the second gate voltage may be induced in the second gate electrode 222 via the upper surface of the channel supply layer 214 contacting the coating layer 231. A voltage lower than that applied to the first gate electrode 221 may be induced in the second gate electrode 222. The second gate voltage induced in the second gate electrode 222 may be determined by the first gate voltage applied to the first gate electrode 221, a gap between the first gate electrode 221 and the second gate electrode 222, and a gap between the source electrode 251 and the second gate electrode 222. The second gate voltage induced in the second gate electrode 222 may be adjusted by changing a location of the first gate electrode 221 and/or the second gate electrode 222. Although it has been described that one second gate electrode 222 is formed between the source electrode 251 and the first gate electrode 221, a plurality of second gate electrode 222 may be formed between the source electrode 251 and the first gate electrode 221.

Figure 8:
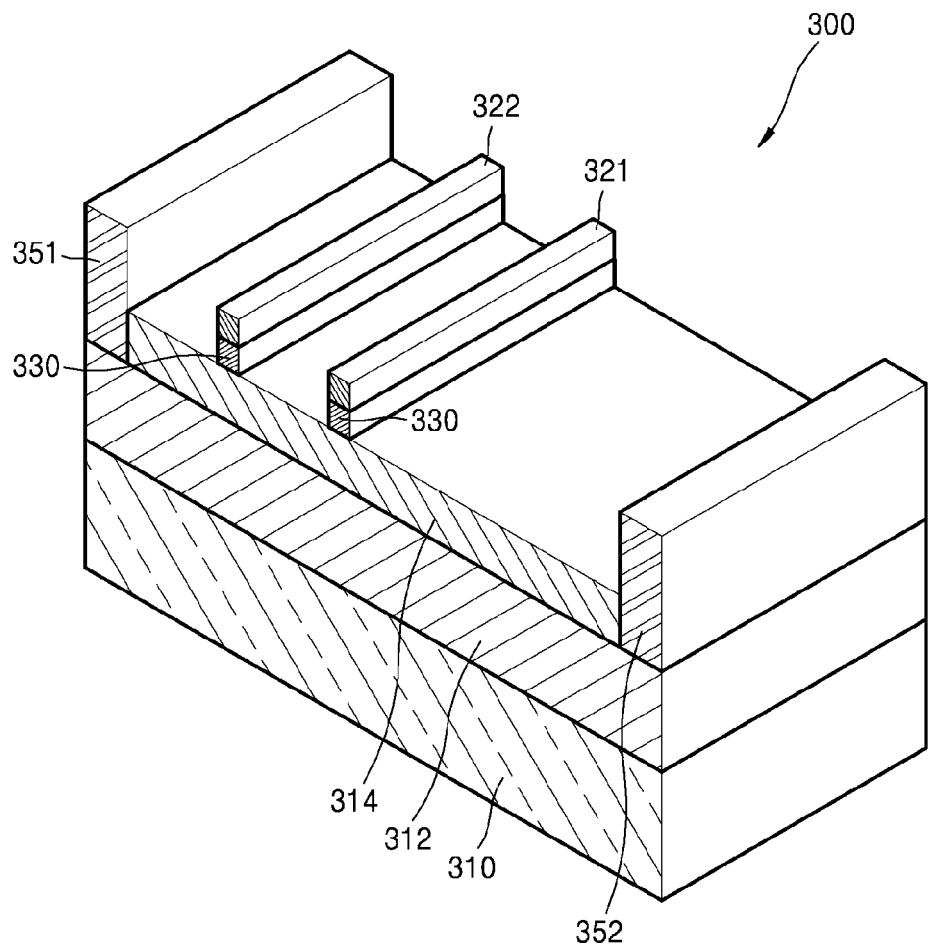
FIG. 8 is a perspective view of an HEMT according to example embodiments.
Figure 9:
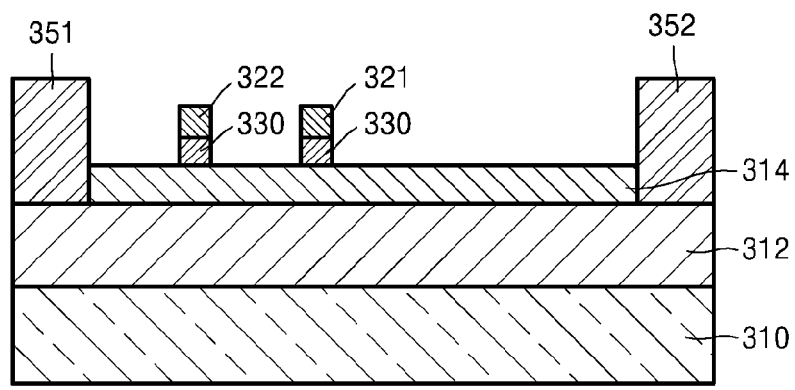
FIG. 9 is a cross-sectional view of the HEMT of FIG. 8.

FIG. 8 is a perspective view of an HEMT 300 according to example embodiments, and FIG. 9 is a cross-sectional view of the HEMT 300 of FIG. 8.

Hereinafter, the differences between FIGS. 6-7 and 8-9 will be mainly described.

Referring to FIGS. 8 and 9, a channel layer 312 including a first semiconductor material is formed on a substrate 310. For example, the channel layer 312 may be a GaN group material layer, in detail, a GaN layer. Although not shown, a desired (and/or alternatively predetermined) buffer layer may be further provided between the substrate 310 and the channel layer 312. A channel supply layer 314 including a second semiconductor material other than the first semiconductor material may be formed on the channel layer 312. The channel supply layer 314 may induce a 2DEG to the channel layer 312. The channel supply layer 314 may include at least one selected from nitrides including at least one selected from the group consisting of, for example, Al, Ga, In, and B and may have a single-layer structure or a multi-layer structure. In detail, the channel supply layer 314 may include at least one selected from the group consisting of AlGaN, AlInN, InGaN, AlN, and AlGaInN but is not limited thereto.

A source electrode 351 and a drain electrode 352 may be formed on the channel layer 312 at both sides of the channel supply layer 314. The source electrode 351 and the drain electrode 352 may be formed on the channel supply layer 314 or formed to be inserted inside the channel supply layer 314 or the channel layer 312. A depletion-forming layer 330 may be formed on the channel supply layer 314. The depletion-forming layer 330 may include a p-type semiconductor material. The depletion-forming layer 330 may include a III-V group nitride semiconductor, for example, at least one selected from the group consisting of GaN, AlGaN, InN, AlInN, InGaN, and AlInGaN. In detail, the depletion-forming layer 330 may be a p-GaN layer or a p-AlGaN layer. The depletion-forming layer 330 may be formed in a shape corresponding to first and second gate electrodes 321 and 322 to be described below.

The first gate electrode 321 may be formed on the depletion-forming layer 330. In addition, the second gate electrode 322 may be formed on the depletion-forming layer 330 and between the source electrode 351 and the first gate electrode 321. The second gate electrode 322 is a floating electrode to which a second gate voltage is induced when a first gate voltage is applied to the first gate electrode 321. In example embodiments, when the first gate voltage is applied to the first gate electrode 321, the second gate voltage may be induced in the second gate electrode 322 via the upper surface of the channel supply layer 314 between the first gate electrode 321 and the second gate electrode 322. A voltage lower than that applied to the first gate electrode 321 may be induced in the second gate electrode 322. The second gate voltage induced in the second gate electrode 322 may be determined by the first gate voltage applied to the first gate electrode 321, a gap between the first gate electrode 321 and the second gate electrode 322, and a gap between the source electrode 351 and the second gate electrode 322. The second gate voltage induced in the second gate electrode 322 may be adjusted by changing a location of the first gate electrode 321 and/or the second gate electrode 322. Although it has been described that one second gate electrode 322 is formed between the source electrode 351 and the first gate electrode 321, a plurality of second gate electrode 322 may be formed between the source electrode 351 and the first gate electrode 321.

Figure 10A:
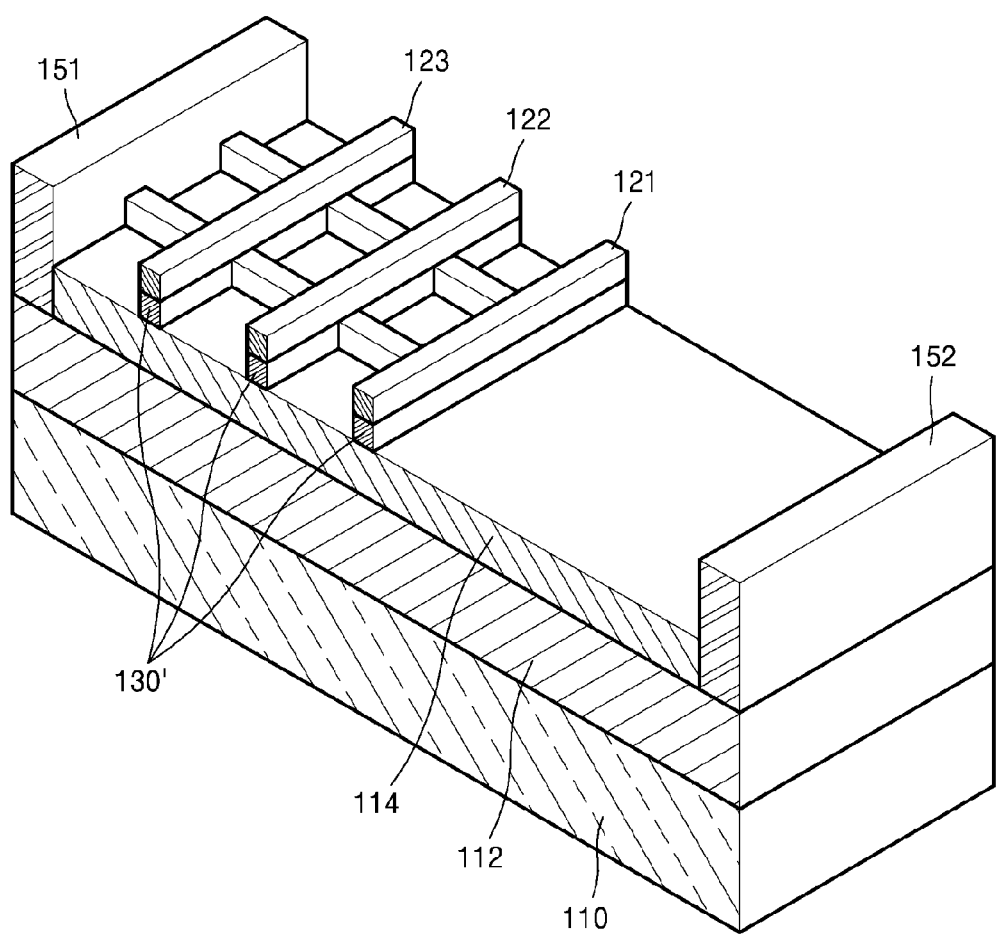
FIGS. 10A and 10B are perspective views of HEMTs according to example embodiments.
Figure 10B:
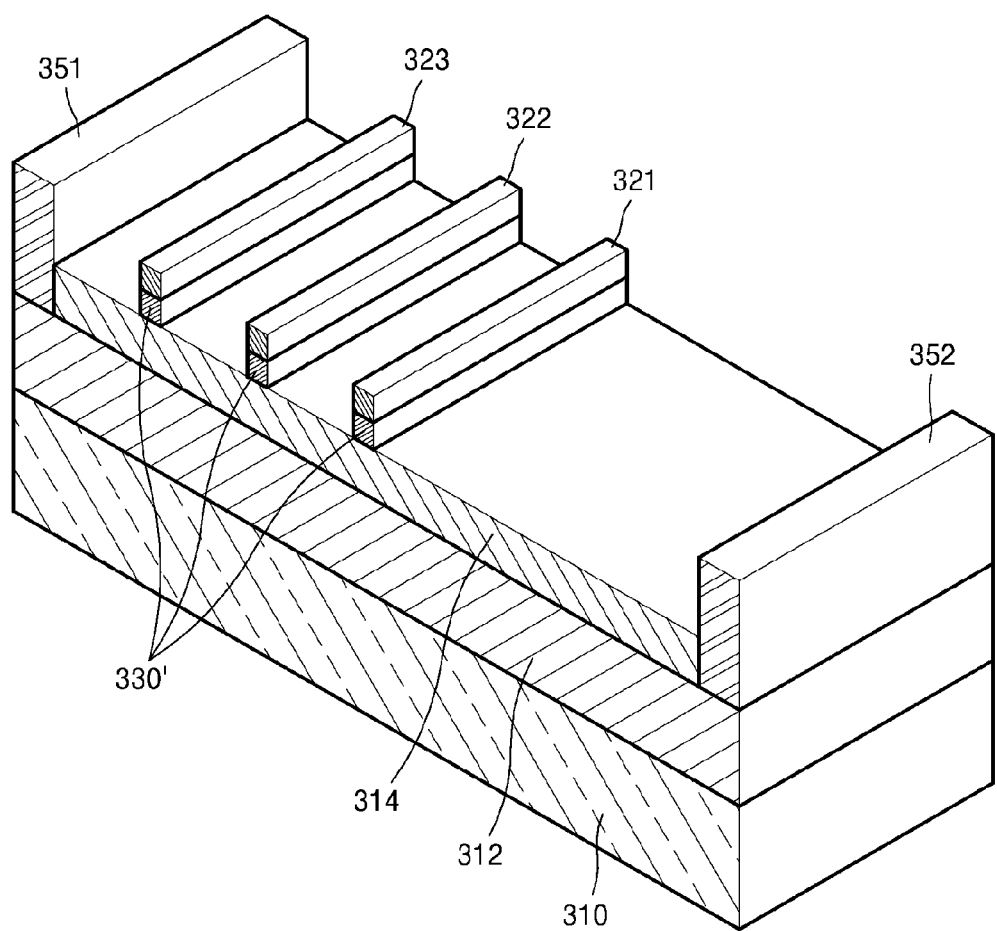

FIGS. 10A and 10B are perspective views of HEMTs according to example embodiments.

Hereinafter, differences between FIG. 10A and FIGS. 1-4 will be mainly described.

Referring to FIG. 10A, a HEMT according to example embodiments may include the same channel supply layer 114, channel layer 112, and substrate 110 as the HEMT according to example embodiments in FIG. 1. Additionally, a buffer layer may be formed between the substrate 110 and the channel layer 112. A seed layer (not shown) for growing the buffer layer may be further formed between the substrate 110 and the buffer layer.

In FIG. 10A, a depletion forming layer 130' may be formed on the channel supply layer 114. The depletion forming layer 130' may include the same materials as the depletion forming layer 130 described previously with respect to FIG. 1. The depletion forming layer 130' may be formed in a grid shape as shown in FIG. 10A so portions of the depletion forming layer 130' are under the first gate electrode 121, the second gate electrode 122, and the third gate electrode 123. Portions of the depletion forming layer 130' may extend between the source electrode 151 and the third gate electrode 123. Portions of the depletion forming layer 130' may extend between the third gate electrode 123 and the second gate electrode 122. Portions of the depletion forming layer 130' may extend between the second gate electrode 122 and the first gate electrode 121. However, the depletion forming layer 130' is not limited thereto and may be formed in various shapes. For example, the depletion forming layer 130' may be formed so a width of the depletion forming layer 130' is different (e.g., less than) than a width of at least one of the first gate electrode 121, the second gate electrode 122, and the third gate electrode 123.

The second gate electrode 122 and/or third gate electrode 123 may be floating electrodes. As such, a second gate voltage may be induced in the second gate electrode 122 if a first gate voltage is applied to the first gate electrode 121. A third gate voltage may be induced in the third electrode 123 based on the second gate voltage induced in the second gate electrode 122.

A portion of the depletion forming layer 130' may contact a sidewall of the source electrode 151.

Hereinafter, differences between FIG. 10B and FIGS. 8-9 will be mainly described.

Referring to FIG. 10B, a HEMT according to example embodiments may include the same channel supply layer 314, channel layer 312, and substrate 310 as the HEMT according to example embodiments in FIG. 8. Additionally, a buffer layer may be formed between the substrate 310 and the channel layer 312. A seed layer (not shown) for growing the buffer layer may be further formed between the substrate 310 and the buffer layer.

In FIG. 10B, a depletion forming layer 330' may be formed on the channel supply layer 314. The depletion forming layer 330' may include the same materials as the depletion forming layer 130 described previously with respect to FIG. 1. The depletion forming layer 330' may be formed in a shape corresponding to first, second, and third gate electrodes 321-323 as shown in FIG. 10B. However, the depletion forming layer 330' is not limited thereto and may be formed in various shapes. For example, the depletion forming layer 330' may be formed so a width of the depletion forming layer 330' is different (e.g., less than) than a width of at least one of the first gate electrode 321, the second gate electrode 322, and the third gate electrode 323.

The second gate electrode 322 and/or third gate electrode 323 may be floating electrodes. As such, a second gate voltage may be induced in the second gate electrode 322 if a first gate voltage is applied to the first gate electrode 321. A third gate voltage may be induced in the third electrode 323 based on the second gate voltage induced in the second gate electrode 322.

Figure 11A:
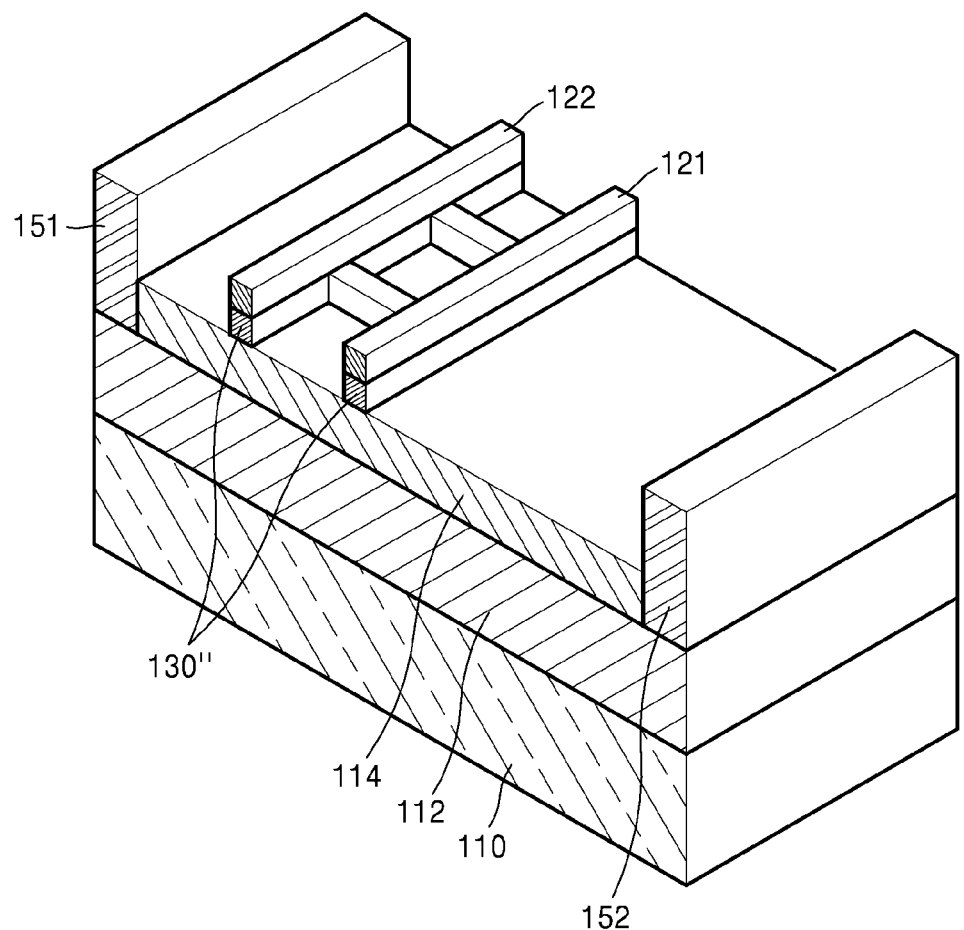
FIGS. 11A and 11B are perspective views of HEMTs according to example embodiments.
Figure 11B:
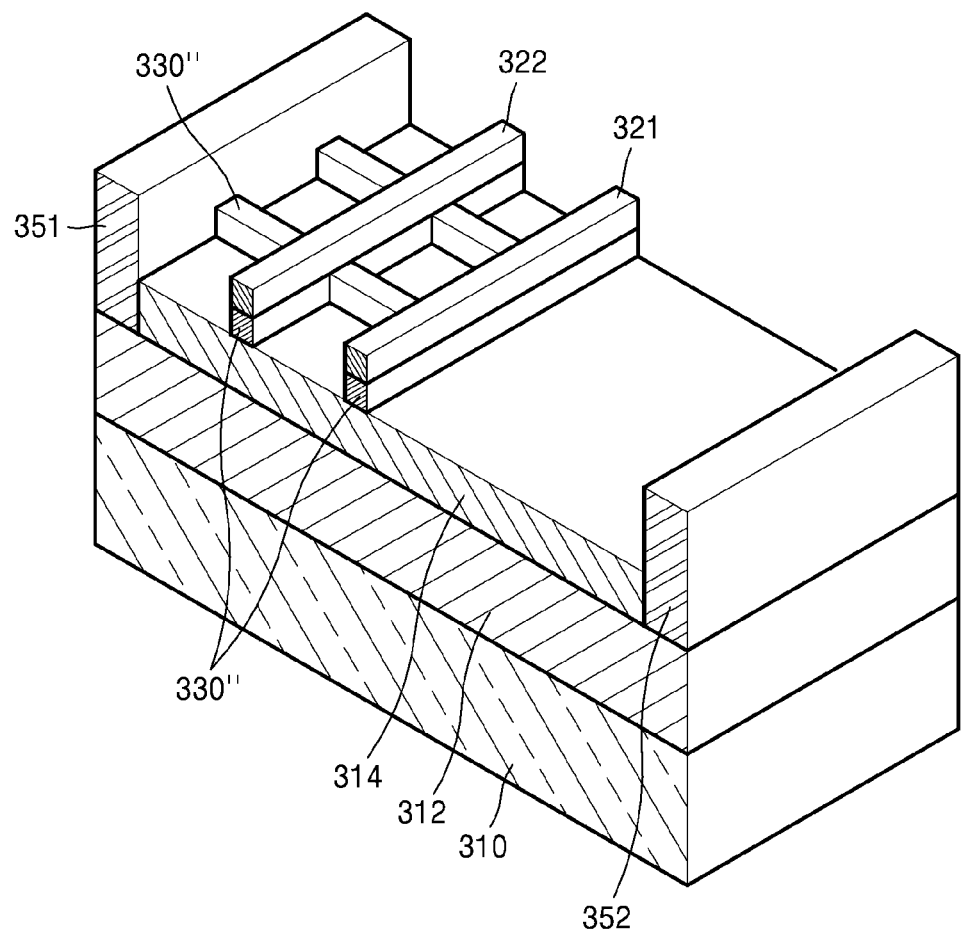

FIGS. 11A and 11B are perspective views of HEMTs according to example embodiments.

Hereinafter, differences between FIG. 11A and FIGS. 1-4 will be mainly described.

Referring to FIG. 11A, a HEMT according to example embodiments may include the same channel supply layer 114, channel layer 112, and substrate 110 as the HEMT according to example embodiments in FIG. 1. Additionally, a buffer layer may be formed between the substrate 110 and the channel layer 112. A seed layer (not shown) for growing the buffer layer may be further formed between the substrate 110 and the buffer layer.

In FIG. 11A, a depletion forming layer 130" may be formed on the channel supply layer 114. The depletion forming layer 130" may include the same materials as the depletion forming layer 130 described previously with respect to FIG. 1. The depletion forming layer 130' may be formed in a grid shape as shown in FIG. 11A so portions of the depletion forming layer 130" are under the first gate electrode 121 and the second gate electrode 122. Portions of the depletion forming layer 130" may extend between the second gate electrode 122 and the first gate electrode 121. However, the depletion forming layer 130" is not limited thereto and may be formed in various shapes. For example, the depletion forming layer 130" may be formed so a width of the depletion forming layer 130" is different (e.g., less than) than a width of the first gate electrode 121 and/or a width of the second gate electrode 122.

Hereinafter, the differences between FIG. 11B and FIGS. 8-9 will be mainly described.

Referring to FIG. 11B, a HEMT according to example embodiments may include the same channel supply layer 314, channel layer 312, and substrate 310 as the HEMT according to example embodiments in FIG. 8. Additionally, a buffer layer may be formed between the substrate 310 and the channel layer 312. A seed layer (not shown) for growing the buffer layer may be further formed between the substrate 310 and the buffer layer.

In FIG. 11B, a depletion forming layer 330" may be formed on the channel supply layer 314. The depletion forming layer 330" may include the same materials as the depletion forming layer 130 described previously with respect to FIG. 1. The depletion forming layer 330" may be formed so portions of the depletion forming layer 330" are under the first gate electrode 321 and the second gate electrode 322. Portions of the depletion forming layer 330" may extend between the source electrode 351 and the second gate electrode 322. However, the depletion forming layer 330" is not limited thereto and may be formed in various shapes. For example, the depletion forming layer 330" may be formed so a width of the depletion forming layer 330" is different (e.g., less than) than a width of the first gate electrode 321 and/or a width of the second gate electrode 322.

A portion of the depletion forming layer 330" may contact a sidewall of the source electrode 351.

As described above, according to example embodiments, an HEMT has a normally-off characteristic and may have a high threshold voltage by forming a second gate electrode that is a floating electrode between a source electrode and a first gate electrode. In addition, by changing locations of the first gate electrode and the second gate electrode, the threshold voltage of the HEMT may be adjusted.

It should be understood that example embodiments described herein should be considered in a descriptive sense only and not for purposes of limitation. Descriptions of features or aspects within each HEMT according to example embodiments should typically be considered as available for other similar features or aspects in other HEMTs according to example embodiments. While some example embodiments have been particularly shown and described, it will be understood by one of ordinary skill in the art that variations in form and detail may be made therein without departing from the spirit and scope of the claims.

What is claimed is:

1. A high electron mobility transistor (HEMT) comprising:
   a channel layer including a first semiconductor material;
   a channel supply layer on the channel layer,
      the channel supply layer including a second semiconductor material,
      the channel supply layer configured to induce a two-dimensional electron gas (2DEG) in the channel layer;
   a source electrode and a drain electrode at both sides of the channel supply layer;
   a depletion-forming layer on the channel supply layer,
      the depletion-forming layer configured to form a depletion region in the 2DEG;
   a first gate electrode on the depletion-forming layer,
      the first gate electrode between the source electrode and the drain electrode; and
   at least one second gate electrode separated from the first gate electrode on the depletion-forming layer and between the source electrode and the drain electrode.

2. The HEMT of claim 1, wherein
   the HEMT includes one second gate electrode,
   the second gate electrode is a floating electrode, and
   the first and second gate electrodes are configured such that applying a first gate voltage to the first gate electrode induces a second gate voltage in the second gate electrode.

3. The HEMT of claim 2, wherein
   the first gate electrode and the second gate electrode are connected to each other by the depletion-forming layer, and
   the first gate electrode is configured to induce the second gate voltage in the second gate electrode via the depletion-forming layer if the first gate voltage is applied to the first gate electrode.

4. The HEMT of claim 3, wherein the depletion-forming layer is a strip shape between the first gate electrode and the second gate electrode.

5. The HEMT of claim 3, wherein the second gate electrode and the source electrode are connected to each other by the depletion-forming layer.

6. The HEMT of claim 5, wherein the depletion-forming layer is a strip shape between the source electrode and the second gate electrode.

7. The HEMT of claim 2, further comprising:
   a coating layer on at least a portion of an upper surface of the channel supply layer.

8. The HEMT of claim 7, wherein a material of the coating layer is the same as a material of the depletion-forming layer.

9. The HEMT of claim 8, wherein a thickness of the coating layer is less than a thickness of the depletion-forming layer.

10. The HEMT of claim 2, wherein the first gate electrode is configured to induce the second gate voltage in the second gate electrode via an upper surface of the channel supply layer.

11. The HEMT of claim 2, wherein the second gate voltage induced in the second gate electrode is determined by the first gate voltage applied to the first gate electrode, a gap between the first gate electrode and the second gate electrode, and a gap between the second gate electrode and the source electrode.

12. The HEMT of claim 11, wherein a threshold voltage of the HEMT is determined based on the second gate voltage induced in the second gate electrode.

13. The HEMT of claim 1, wherein the first semiconductor material is a gallium nitride (GaN) group material.

14. The HEMT of claim 1, wherein the second semiconductor material includes at least one nitride that includes at least one of aluminum (Al), gallium (Ga), indium (In) and boron (B).

15. The HEMT of claim 1, wherein the depletion-forming layer includes a p-type semiconductor material.

16. The HEMT of claim 15, wherein the depletion-forming layer includes a group III-V nitride semiconductor material.

17. A method of driving the HEMT of claim 1, comprising:
   applying a first gate voltage to the first gate electrode,
   inducing a second gate voltage in a floating electrode by applying the first gate voltage to the first gate electrode,
   wherein the HEMT includes one second gate electrode and the second gate electrode is the floating electrode.

18. The method of claim 17, wherein the first gate electrode and the second gate electrode are connected to each other by the depletion-forming layer.

19. The method of claim 18, wherein the second gate electrode and the source electrode are connected to each other by the depletion-forming layer.

20. The method of claim 17, wherein the HEMT further includes a coating layer on at least a portion of an upper surface of the channel supply layer.

21. The method of claim 17, wherein applying the first gate voltage to the first gate electrode induces the second gate voltage in the second gate electrode via an upper surface of the channel supply layer.

22. The method of claim 17, wherein a threshold voltage of the HEMT is determined by the second gate voltage induced in the second gate electrode.

23. The method of claim 17, wherein the second gate voltage induced in the second gate electrode is determined by the first gate voltage applied to the first gate electrode, a gap between the first gate electrode and the second gate electrode, and a gap between the second gate electrode and the source electrode.

24. The HEMT of claim 1, wherein the at least one second gate electrode is one second gate electrode between the first gate electrode and the source electrode.

25. A high electron mobility transistor (HEMT) comprising:
a channel layer;
a channel supply layer on the channel layer,
the channel supply layer configured to induce a two-dimensional electron gas (2DEG) in the channel layer;
a source electrode and a drain electrode spaced apart on the channel layer;
a depletion-forming layer on the channel supply layer,
the depletion-forming layer configured to form a depletion region in the 2DEG; and
a plurality of gate electrodes on the depletion-forming layer between the source electrode and the drain electrode,
the plurality of gate electrodes including a first gate electrode and a second gate electrode laterally spaced apart from each other.

26. The HEMT of claim 25, wherein
the second gate electrode is a floating electrode between the source electrode and the first gate electrode, and
the first and second gate electrodes are configured such that applying a first gate voltage to the first gate electrode induces a second gate voltage in the second gate electrode.

27. The HEMT of claim 26, wherein
the plurality of electrodes includes a third gate electrode on the depletion-forming layer, and
the third gate electrode is spaced apart between the second gate electrode and the source electrode.

28. The HEMT of claim 27, wherein a portion of the depletion-forming layer extends between at least two of the first electrode, the second electrode, the third electrode, and the source electrode.

29. The HEMT of claim 26, wherein a portion of the depletion-forming layer extends from the second gate electrode to at least one of the source electrode and the first gate electrode.

30. The HEMT of claim 26, wherein the depletion forming layer exposes at least one of:
an entire upper surface of the channel supply layer between the source electrode and the second gate electrode,
an entire upper surface of the channel supply layer between the second gate electrode and the first gate electrode.

31. The HEMT of claim 26, wherein at least one of the source electrode and the drain electrode is connected to a sidewall of the channel supply layer.

32. The HEMT of claim 26, wherein the depletion forming layer has a grid shape.

33. The HEMT of claim 25, wherein channel layer includes a group III-V compound semiconductor.

34. The HEMT of claim 25, wherein a material of the channel supply layer is different than a material of the channel layer in terms of at least one of a polarization characteristic, an energy band gap, and a lattice constant.

35. The HEMT of claim 25, wherein the depletion-forming layer includes a p-type semiconductor material.

36. The HEMT of claim 25, wherein the second gate electrode is configured to raise a threshold voltage of the HEMT compared to a similar-formed HEMT that does not include the second gate electrode.

37. A method of driving the HEMT of claim 25, comprising:
applying a first gate voltage to the first gate electrode; and
inducing a second gate voltage in the second gate electrode by applying the first gate voltage to the first gate electrode.

38. The method of claim 37, wherein
the applying the first gate voltage includes forming a first channel under the first gate electrode in the channel layer, and
the first gate voltage is greater than a first threshold voltage for forming the first channel.

39. The method of claim 38, wherein
the applying the first gate voltage induces the second gate voltage in the second gate electrode at a level that is greater than a second threshold voltage for forming a second channel under the second gate electrode in the channel layer, and
the applying the first gate voltage further includes forming the second channel under the second gate electrode in the channel layer.

* * * * *